United States Patent
Kumai et al.

(10) Patent No.: US 10,986,293 B2
(45) Date of Patent: Apr. 20, 2021

(54) SOLID-STATE IMAGING DEVICE INCLUDING MICROLENSES ON A SUBSTRATE AND METHOD OF MANUFACTURING THE SAME

(71) Applicant: TOPPAN PRINTING CO., LTD., Taito-ku (JP)

(72) Inventors: Koichi Kumai, Taito-ku (JP); Ryohei Gorai, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 15/976,992

(22) Filed: May 11, 2018

(65) Prior Publication Data

US 2018/0269247 A1    Sep. 20, 2018

Related U.S. Application Data

(63) Continuation of application No. PCT/JP2016/083725, filed on Nov. 14, 2016.

(30) Foreign Application Priority Data

Nov. 13, 2015  (JP) .............................. JP2015-222937
Mar. 28, 2016  (JP) .............................. JP2016-063186

(51) Int. Cl.
*H01L 27/14*     (2006.01)
*H04N 5/369*    (2011.01)
*G02B 3/00*     (2006.01)
*H01L 27/146*   (2006.01)

(52) U.S. Cl.
CPC .............. *H04N 5/369* (2013.01); *G02B 3/00* (2013.01); *H01L 27/14* (2013.01); *H01L 27/14621* (2013.01); *H01L 27/14627* (2013.01); *H01L 27/14645* (2013.01); *H01L 27/14685* (2013.01)

(58) Field of Classification Search
CPC ................................................. H01L 27/14527
See application file for complete search history.

(56) References Cited

U.S. PATENT DOCUMENTS

| | | | |
|---|---|---|---|
| 2008/0011936 | A1 | 1/2008 | Kuo et al. |
| 2009/0078855 | A1 | 3/2009 | Kuo et al. |
| 2015/0214270 | A1 | 7/2015 | Yomori et al. |

FOREIGN PATENT DOCUMENTS

| | | | |
|---|---|---|---|
| JP | 2000-260969 A | | 9/2000 |
| JP | 2000-260970 A | | 9/2000 |
| JP | 2006-165162 A | | 6/2006 |
| JP | 2009-31399 A | | 2/2009 |
| JP | 2012-99639 A | | 5/2012 |
| JP | 2015-158663 A | | 9/2015 |
| WO | WO 2014/104913 A1 | * | 7/2014 |

OTHER PUBLICATIONS

International Search Report dated Jan. 17, 2017 in PCT/JP2016/083725, filed Nov. 14, 2016, 5 pages.

Extended European Search Report dated May 23, 2019 in Patent Application No. 16864390.6, 6 pages.

* cited by examiner

*Primary Examiner* — Suberr L Chi

(74) *Attorney, Agent, or Firm* — Oblon, McClelland, Maier & Neustadt, L.L.P.

(57) ABSTRACT

A solid-state imaging device including a substrate having a surface, microlenses formed on the surface, and a concave lens formed between adjacent ones of the microlenses and having a concave shape directed toward the surface of the substrate.

13 Claims, 10 Drawing Sheets

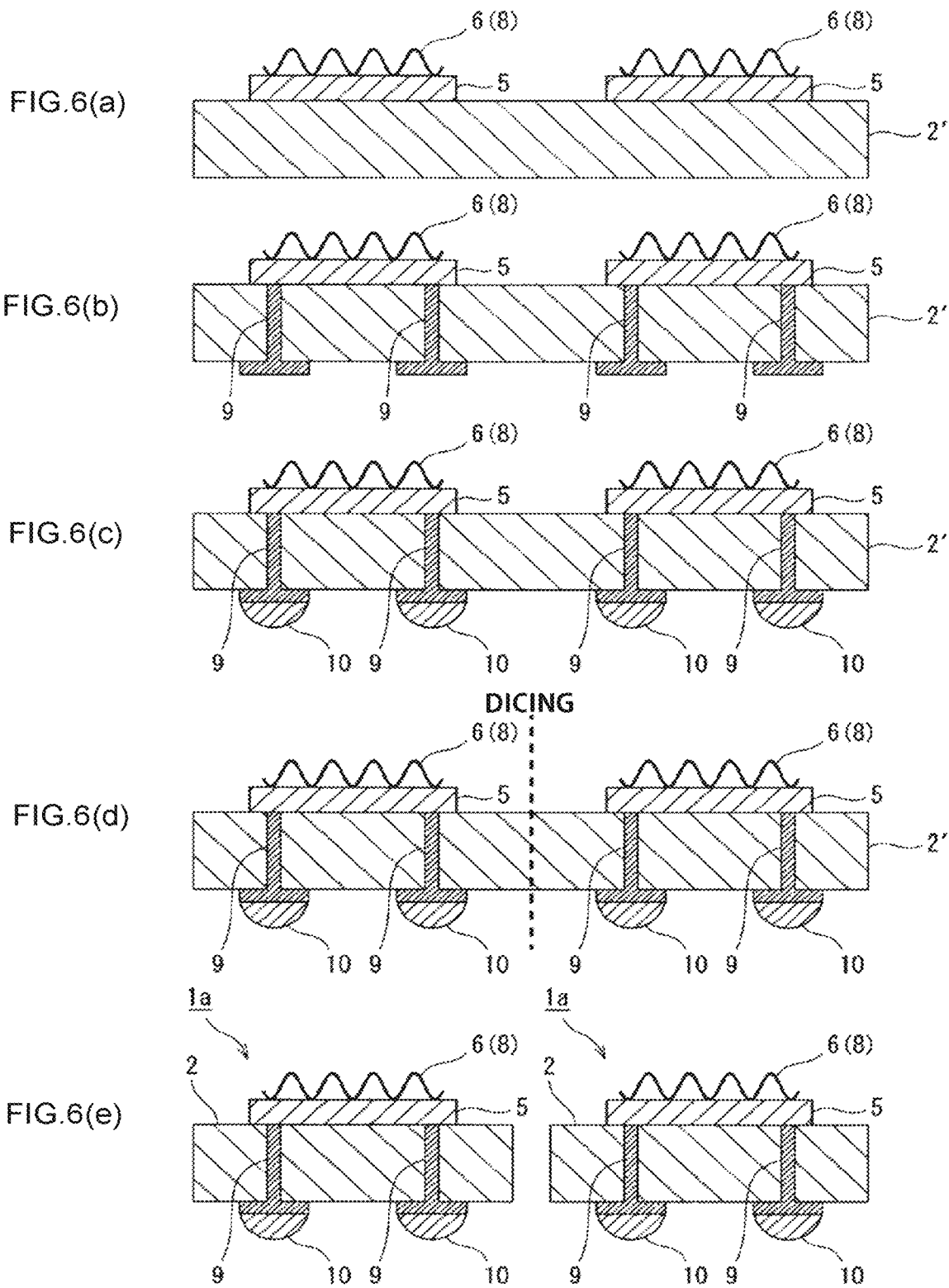

EXPOSING TO LIGHT

ETCHING

SOLID-STATE IMAGING DEVICE INCLUDING MICROLENSES ON A SUBSTRATE AND METHOD OF MANUFACTURING THE SAME

CROSS-REFERENCE TO RELATED APPLICATIONS

The present application is a continuation of International Application No. PCT/JP2016/083725, filed Nov. 14, 2016, which is based upon and claims the benefits of priority to Japanese Application No. 2015-222937, filed Nov. 13, 2015, and Japanese Application No. 2016-063186, filed Mar. 28, 2016. The entire contents of all of the above applications are incorporated herein by reference.

BACKGROUND OF THE INVENTION

Field of the Invention

The present invention relates to a solid-state imaging device and a method of manufacturing the same.

Discussion of the Background

Prior arts relating to a solid-state imaging device and a method of manufacturing the same include those described in Patent Literatures (PTL) 1 to 3.
  PTL 1 JP-2000-260969 A
  PTL 2 JP-2000-260970 A
  PTL 3 JP-2006-165162 A

SUMMARY OF THE INVENTION

According to an aspect of the present invention, a solid-state imaging device includes a substrate having a surface, microlenses formed on the surface, and a concave lens formed between adjacent ones of the microlenses and having a concave shape directed toward the surface of the substrate.

According to another aspect of the present invention, a solid-state imaging device includes photoelectric transducers formed on a substrate in a square lattice pattern and arrayed in two directions on the substrate, color filters formed respectively on the photoelectric transducers, and microlenses formed respectively on the color filters. The microlenses include adjacent microlenses having a valley portion formed therebetween. The valley portion is one of valley portions formed in the square lattice pattern and arrayed in the two directions such that each of the valley portions is formed between the adjacent microlenses. Each of the valley portions has a curvature radius of 100 nm or less in a lateral cross section along a direction which is one of the two directions and is parallel to a thickness direction of the substrate. Each of the valley portions has a curvature radius of 100 nm or less in a 45-degree cross section along a direction which is inclined by 45 degrees relative to the one of the two directions on the substrate and is parallel to the thickness direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 6(a)-6(e) are explanatory views illustrating a method of manufacturing a solid-state imaging device according to Example 2-1 of the present invention.

DESCRIPTION OF THE EMBODIMENTS

Figure 1A:
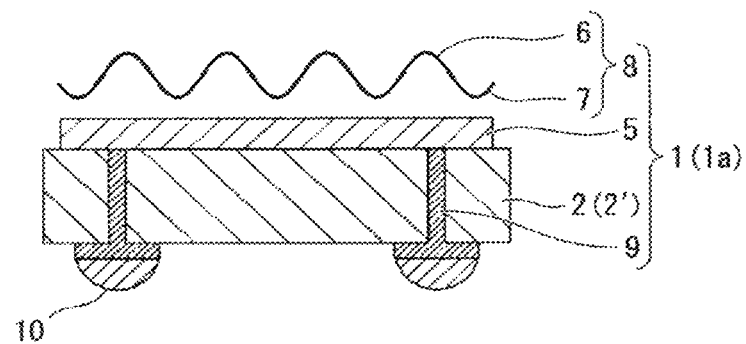
FIG. 1(a) is a cross-sectional view illustrating an exemplary configuration of a solid-state imaging device according to a first embodiment of the present invention.

The embodiments will now be described with reference to the accompanying drawings, wherein like reference numerals designate corresponding or identical elements throughout the various drawings.

Modes (hereinafter referred to as embodiments) for practicing the present invention will be described with reference to the drawings. In the drawings described below, the same reference numerals are given to parts corresponding to each other, omitting description of the duplicate parts as appropriate. Each embodiment of the present invention exemplifies a configuration for embodying the technical idea of the present invention, and is not intended to limit a material, a shape, a structure, an arrangement, a size and others of each part to those set out below. The technical idea of the present invention is subject to various modifications within the technical scope defined by the claims recited in the Claims section.

First Embodiment

<Configuration>

Hereinafter described are main components of the solid-state imaging device according to the first embodiment of the present invention. A detailed configuration of the solid-state imaging device will be described in the second embodiment of the present invention described later.

Figure 1B:
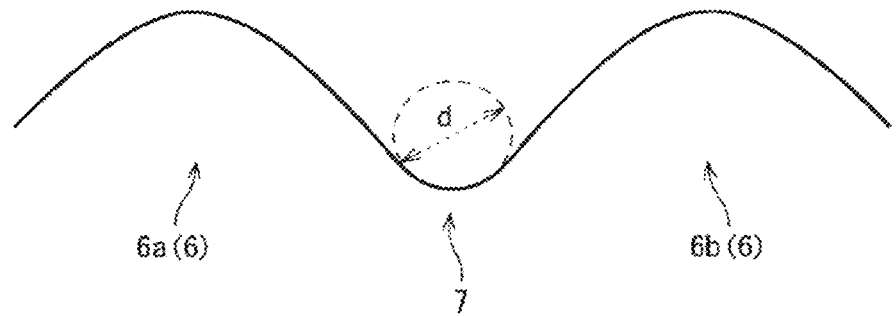
FIG. 1(b) is an enlarged view of an exemplary configuration of the microlens according to the first embodiment.

FIG. 1(a) is a cross-sectional view illustrating an exemplary configuration of a solid-state imaging device according to a first embodiment of the present invention. More specifically, FIG. 1(a) is a cross-sectional view illustrating an exemplary configuration of the entire solid-state imaging device according to the first embodiment, and FIG. 1(b) is an enlarged view of an exemplary configuration of the microlens according to the first embodiment.

As shown in FIG. 1(a), a solid-state imaging device 1(1a) according to the present embodiment includes a semiconductor substrate (substrate) 2 and a lens module 8 formed on one surface (an upper surface in FIG. 1(a)) side of the semiconductor substrate 2. As shown in FIGS. 1(a) and 1(b), the lens module 8 has a plurality of microlenses 6 and a plurality of concave lenses 7 respectively arranged at a fixed interval in a longitudinal direction and a lateral direction in plan view. Each of the plurality of microlenses 6 has a convex shape that protrudes from a surface (the upper surface in FIGS. 1(a) and 1(b)) of the lens module 8 (in other words, it is a convex lens). Each of the plurality of concave lenses 7 assumes a concave shape that recesses from the surface of the lens module 8 toward one surface of the semiconductor substrate 2. Each of the plurality of concave lenses 7 is located at a boundary between adjacent microlenses 6 of the plurality of microlenses 6.

Although not shown, a large number of photoelectric transducers are formed on one surface of the semiconductor substrate 2. A photodiode is illustrated as a photoelectric transducer. In addition, a CMOS or CCD is illustrated as a system for transferring photoelectrically converted charges. Further, a color separation filter (hereinafter also simply referred to as a "color filter") 5 and a condensing microlens 6 are formed on one surface of the semiconductor substrate 2. The large number of photoelectric transducers are covered by the color filter 5 and the condensing microlens 6. For example, one colored layer (a layer colored in one of the three colors of green (G), blue (B), and red (R)) of the color filter 5 is disposed above one photoelectric transducer, and one microlens 6 is disposed thereabove. This combination forms one pixel.

Although FIG. 1(a) shows the color filter 5 and omits the photoelectric transducer underneath, the solid-state imaging device 1a in the present specification includes the semiconductor substrate 2, the plurality of photoelectric transducers, the color filter 5, and the lens module 8.

As shown in FIG. 1(a), a through-hole is provided in the semiconductor substrate 2, the through-hole extending from one surface thereof to another surface (the lower surface in FIG. 1(a)). Filling the through-hole with a conductive material or covering an inner wall thereof forms a through-hole electrode 9. On another surface of the semiconductor substrate 2, a BGA type connection bump 10 is formed.

The connection bump 10 is also referred to as an external connection pad. A single through-hole electrode 9 is electrically connected to a single connection bump 10.

An electrical signal of an image information captured by the solid-state imaging device 1a passes through an electrode (not shown) formed on the one surface of the semiconductor substrate 2 and the through-hole electrode 9 to be guided to a rear surface of the semiconductor substrate 2 before being output to an external circuit or the like via the connection bump 10.

In the solid-state imaging device 1a according to the present embodiment, a light-shielding electroless plating layer for preventing flare may be applied on a side wall of the lens module 8. Examples of the light-shielding electroless plating layer include a single plating layer of metal selected from nickel, chromium, cobalt, iron, copper, gold and others and an electroless plating layer of an alloy selected from combinations of nickel-iron, cobalt-iron, copper-iron, etc. In addition, a metal light-shielding layer having a low optical reflectance on the surface is also possible, the layer being produced by electrolessly depositing copper and other metal, followed by applying a chemical treatment or an oxidation treatment to its surface, to form a metal compound.

<Manufacturing Method>

In the method of manufacturing the solid-state imaging device 1a according to the present embodiment, a plurality of microlenses 6 and a plurality of concave lenses 7 are collectively formed by a photolithography method by use of a gray-tone mask 50, which will be described later. This point will be described in detail as an example in the present specification.

Example 1-1

Figure 2A:
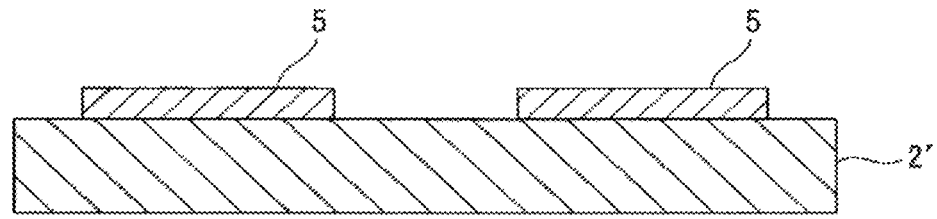
FIGS. 2(a)-2(d) are explanatory views illustrating a method of manufacturing a solid-state imaging device according to Example 1-1 of the present invention.

FIGS. 2(a) to 3(d) are cross-sectional views illustrating a method of manufacturing the solid-state imaging device 1a according to Example 1-1 of the present invention in the order of the manufacturing process. A silicon wafer 2' having a 0.75-mm thickness and a 20-cm diameter was prepared as shown in FIG. 2(a). The silicon wafer 2' was a pre-separated silicon substrate. A photoelectric transducer, a light-shielding film, and a passivation film were formed on one surface (the upper surface in FIGS. 2(a)-3(d)) of the silicon wafer 2' and a flattening layer is form on a top layer by spin-coating a thermosetting acrylic resin coating solution. G, B, and R color filters 5 were subsequently formed on the flattening layer, each of which was formed by carrying out a photolithography method. Note that illustration of the photoelectric transducer and the flattening layer is omitted in FIG. 2(a).

Colorant used for a green resist was, for example, C.I. Pigment Yellow 139, C.I. Pigment Green 36, and C.I. Pigment Blue 15:6. Furthermore, a color resist to which an organic solvent such as cyclohexanone and PGMEA, a polymer varnish, a monomer, and an initiator were added was also used.

Colorant used for a blue resist was, for example, C.I. Pigment Blue 15:6 and C.I. Pigment Violet 23. Furthermore, a color resist to which an organic solvent such as cyclohexanone and PGMEA, a polymer varnish, a monomer, and an initiator were added was also used.

Colorant used for a red resist was C.I. Pigment Red 117, C.I. Pigment Red 48:1, and C.I. Pigment Yellow 139. A composition other than the colorant was similar to that of the green resist.

The arrangement of colored pixels was a so-called Bayer arrangement, an arrangement in which a G (green) filter was provided at every other pixel and an R (red) filter and a B (blue) filter were provided on every other line between the G filters.

Figure 2B:
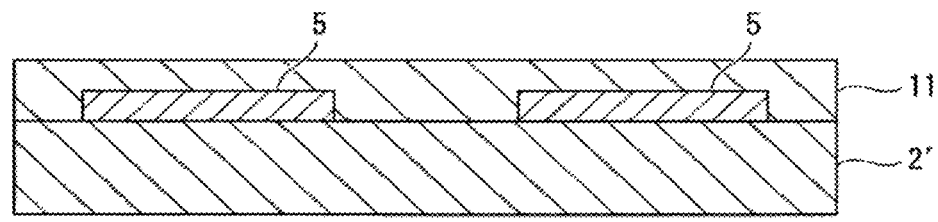

As shown in FIG. 2(b), a photosensitive microlens material 11 was then formed on the one surface of the silicon wafer 2' to cover the color filters 5. Here the photosensitive microlens material 11 was formed on the color filter 5 by application of a 1-μm thin styrene resin that was alkali-soluble, photosensitive, and thermally reflowable. Example 1-1 is an example in which the lens module 8 shown in FIGS. 1(a) and 1(b) consists of photosensitive microlens material 11. The photosensitive microlens material 11 was a photosensitive transparent resin of a positive type.

Figure 2C:
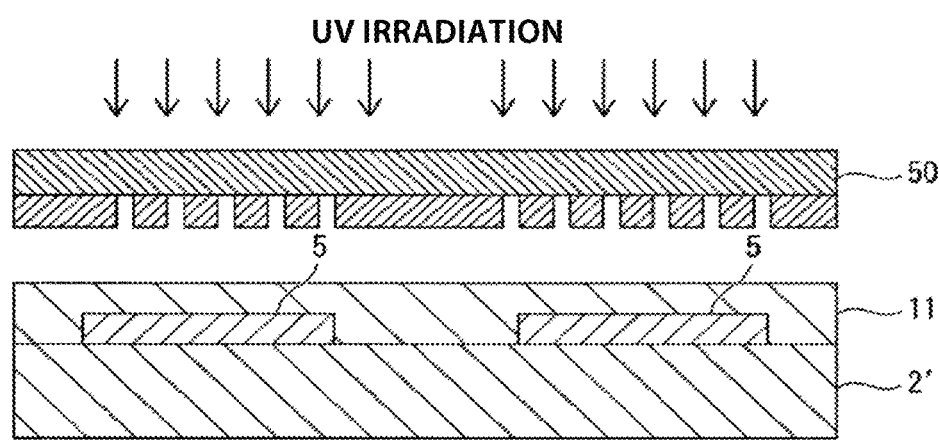

The photosensitive microlens material 11 was then exposed to light as shown in FIG. 2(c). A gray-tone mask 50, a special exposure mask, was used here because a convex shape of the microlens 6 and a concave shape of a concave lens 7 were controlled by an exposure method. Specifically, the photosensitive microlens material 11 was heat-treated at 250° C. to form the microlenses 6 after being patterned through an ultraviolet-ray (i-ray) photolithographing process by use of the gray-tone mask 50. The microlens 6 assumed a gentle semi-parabolic shape that was approximately 0.6 μm thick. The concave lens 7 that was present between adjacent microlenses 6 had a 0.3-μm concave curvature diameter d (see FIG. 1(b)).

The gray-tone mask 50 is a light-shielding film formed on a quartz substrate, the light-shielding film having high transmittance in a part corresponding to a thin part of a lens element to be formed. That is, a mask with a gradation of shades on the light-shielding film was used. The shading of this gradation is achieved by a partial difference of a number of small diameter dots per unit area (density), dots that are not resolved by exposure light.

Figure 2D:
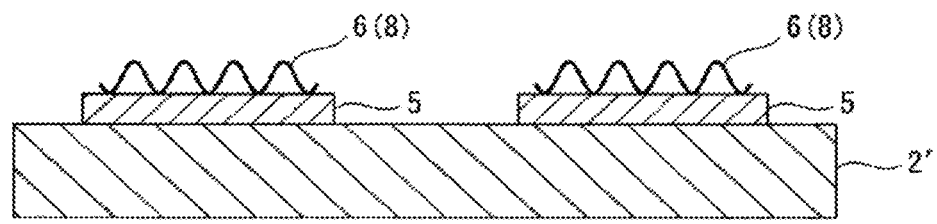

Thus, the solid-state imaging device 1a multi-layered on a silicon wafer 2' as shown in FIG. 2(d) was prepared.

A photoresist was then applied onto a rear surface of the silicon wafer 2' described above to form an opening at a site where the through-hole electrode 9 should be formed by a standard photolithography method. The silicon wafer 2' was reactive-ion-etched to a predetermined depth by use of the photoresist film as a mask to form a through-hole.

Figure 3A:
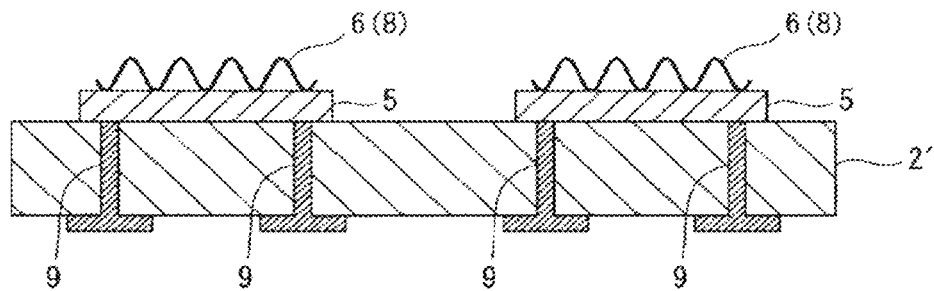
FIGS. 3(a)-3(d) are explanatory views illustrating a method of manufacturing a solid-state imaging device according to Example 1-1 of the present invention.

An $SiO_2$-insulating film was then formed on an inner wall, a bottom, and a whole rear surface of the through-hole by a CVD method to insulate the silicon wafer 2' from a wiring layer that will be formed later. The insulating film was formed to be thinner at the bottom of the through-hole (a part on a front surface of the silicon wafer 2' where a pad made of a highly conductive metal such as aluminum was formed) than at a rear surface of the silicon wafer 2'. The silicon wafer 2' was then reactive-ion-etched once again to remove the insulating film at the bottom of the through-hole. A conductive film was subsequently formed by a sputtering method to bury the through-hole and form the wiring layer on the rear surface of the silicon wafer 2'. In other words, the through-hole electrode 9 was formed as shown in FIG. 3(a).

Figure 3B:
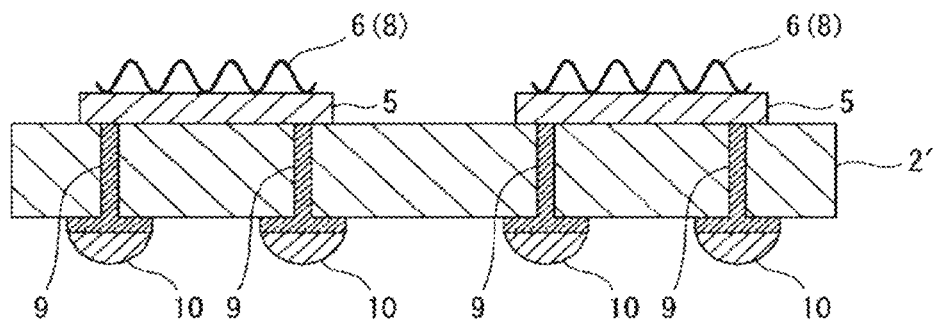

A part of the wiring layer, a part to be connected to an outside, was then exposed by a standard photolithography method. Solder paste was screen-printed onto the exposed part to mount a solder ball. Removing residual flux through a reflow treatment produced a solid-state imaging device substrate having connection bumps 10, as shown in FIG. 3(b).

Figure 3C:
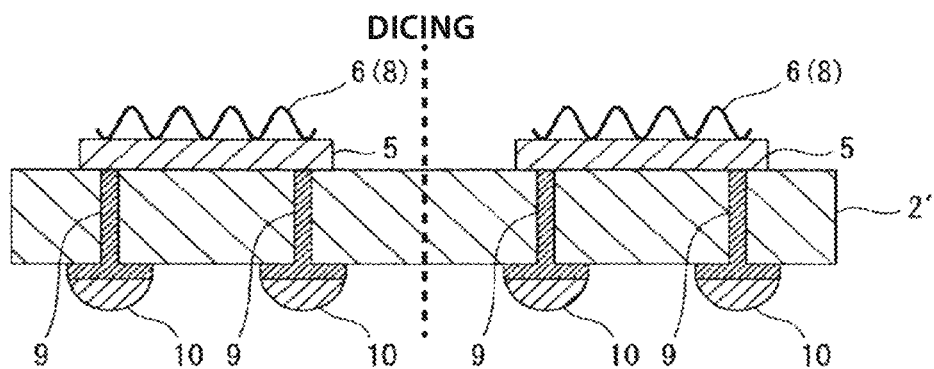
Figure 3D:
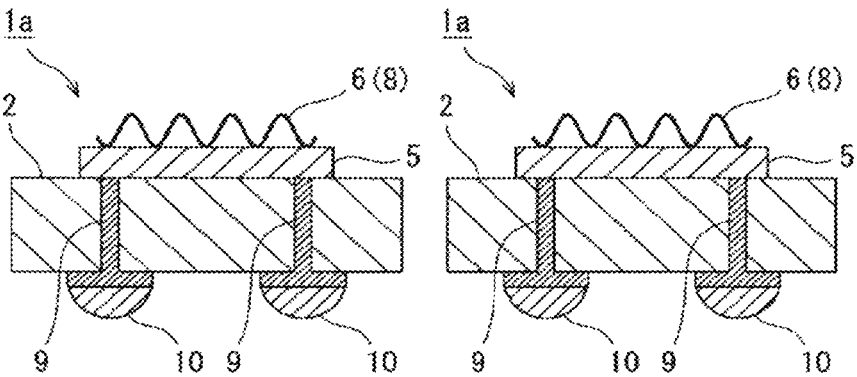

As shown in FIG. 3(c), a cutting groove was then formed from a surface by use of a dicing device with a 450-meshed resin blade along an intermediate part of the solid-state imaging device 1a multi-faced in a matrix form. Each solid-state imaging device 1a was thereafter separated to produce a finished product as shown in FIG. 3(d).

It is also possible to control a shape and light transmittance of the microlens 6 by carrying out a bleaching and other step as necessary.

Figure 4A:
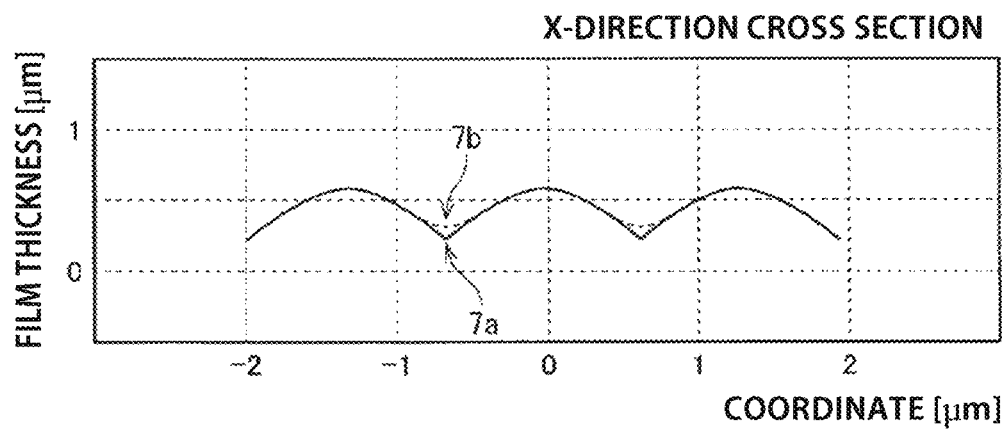
FIGS. 4(a)-4(c) are views illustrating atomic force microscope (AFM) profiles of an X-direction cross section and an XY-direction diagonal cross section of a microlens according to Example 1-1 of the present invention.
Figure 4B:
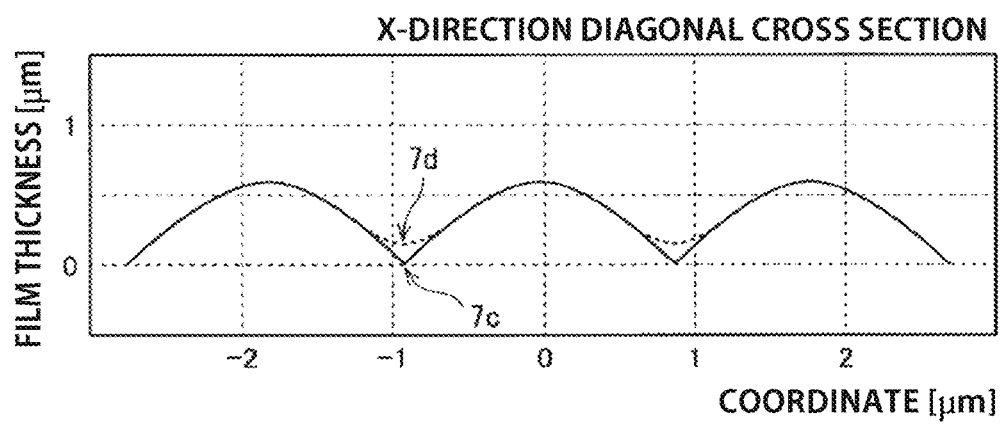
Figure 4C:
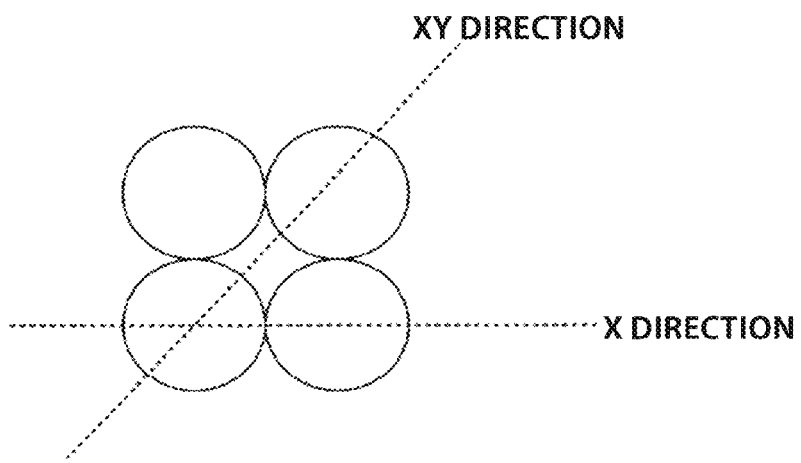

FIG. 4(a) shows an atomic force microscope (AFM) profile of a cross section in an X direction of the microlens 6 produced in Example 1-1 and an AFM profile of a cross section in an X direction of a conventional microlens, these profiles being overlapped with each other. FIG. 4(b) shows an AFM profile of a diagonal cross section in an XY direction of the microlens 6 produced in Example 1-1 and an AFM profile of a diagonal cross section in an XY direction of a conventional microlens, these profiles being overlapped with each other. FIG. 4(c) shows a relation between the X direction and the XY direction in a plan view. For the conventional microlens, valleys having V-shapes 7a and 7c, which are indicated by a solid line, are formed between adjacent microlenses 6. In contrast, concave shapes 7b and 7d, which are indicated by broken lines, are formed between adjacent microlenses 6 in Example 1-1.

Example 1-2

Figure 5A:
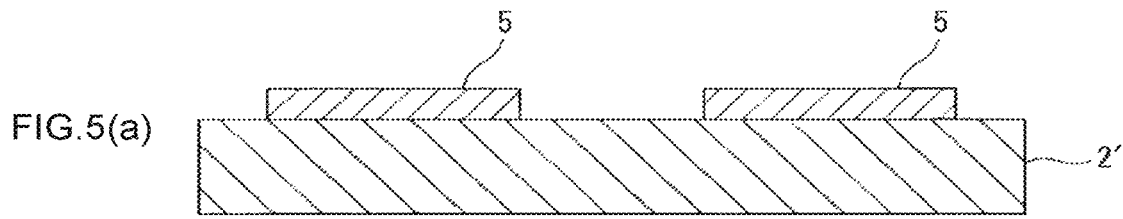
FIGS. 5(a)-5(d) are explanatory views illustrating a method of manufacturing a solid-state imaging device according to Example 1-2 of the present invention.

FIGS. 5(a) to 6(e) are cross-sectional views illustrating a method of manufacturing the solid-state imaging device 1a according to Example 1-2 of the present invention in the order of the manufacturing process. A silicon wafer 2' having a 0.75-mm thickness and a 20-cm diameter was prepared as shown in FIG. 5(a). A description on the silicon wafer 2' will be omitted here because it is identical to the silicon wafer 2' described in Example 1-1.

Figure 5B:
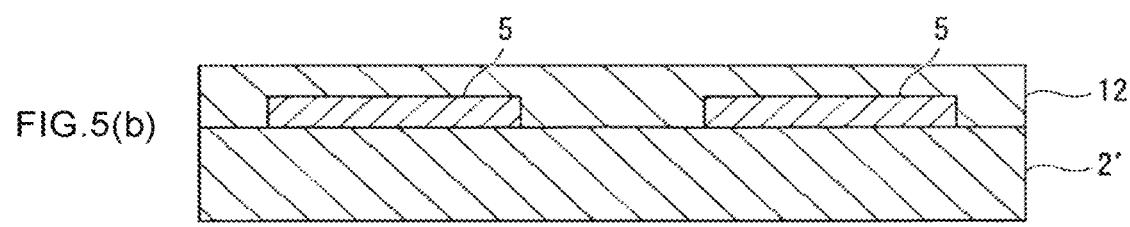

As shown in FIG. 5(b), an acrylic resin liquid was applied on one surface of the silicon wafer 2' to form a 1-μm thick transparent resin layer 12, before heating the transparent resin layer 12 at 180° C. for 3 minutes for hardening, the acrylic resin liquid having a benzene ring that is introduced into a resin skeleton and being applied such that the liquid will cover the color filter 5.

Figure 5C:
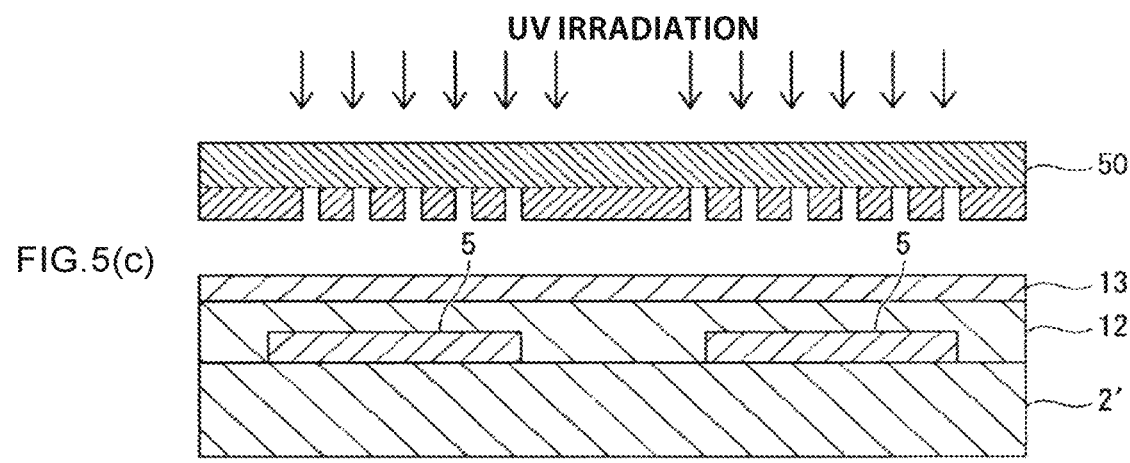

In addition, as shown in FIG. 5(c), an alkali-soluble, photosensitive, and thermal reflowable styrene resin was applied on the hardened transparent resin layer 12 to form a photosensitive sacrificial layer 13.

The photosensitive sacrificial layer 13 was then patterned through a photolithographing process by use of a KrF laser that uses the gray-tone mask 50 before being heat-treated at 250° C. to form a lens mold 13a at a 0.1 μm thermally flowed lens pitch by on one side. The lens mold 13a was gently semi-parabolic and approximately 0.7 μm thick. A concave lens 7 that was present between adjacent lens molds 13a had a 0.2-μm concave curvature diameter d.

Figure 5D:
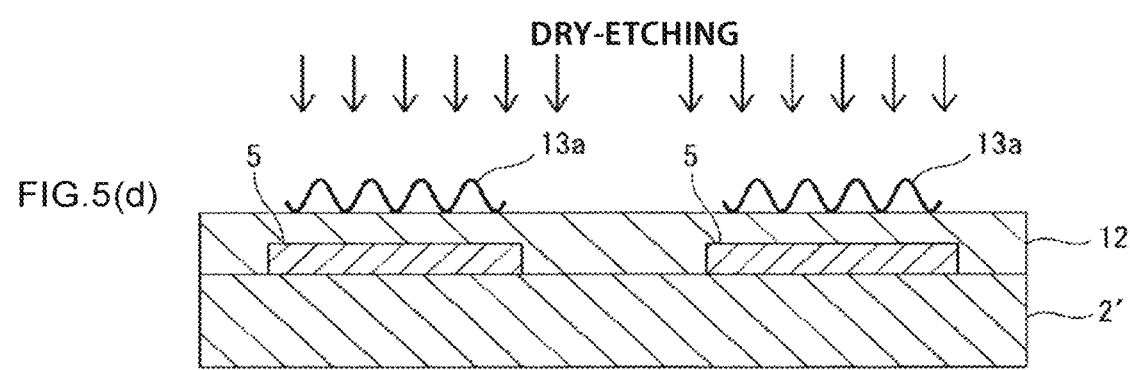

Then, as shown in FIG. 5(d), the photosensitive sacrificial layer 13 was dry-etched by use of a mixed gas of fluorocarbon gases $CF_4$ and $C_3F_8$ before a pattern of the lens mold 13a was transferred to the transparent resin layer 12, which was made of an acrylic resin, to form a microlens 6. The microlens 6 was approximately 0.6 μm high, being lower than the lens mold 13a. The dry etching process was carried out for 5 minutes. The microlens 6 was gently semi-parabolic and approximately 0.6 μm thick. The concave lens 7 that was present between adjacent microlenses 6 had a 0.2-μm concave curvature diameter d (see FIG. 1(b)).

In the photolithography method using the gray-tone mask 50, using the KrF laser makes it possible to control the concave curvature diameter d in the concave lens 7 (see FIGS. 1(a) and 1(b)) within a range from 120 nm to 248 nm by virtue of a wavelength limit resolution of the KrF laser.

Thus, the solid-state imaging device 1a multi-layered on the silicon wafer 2' was produced as shown in FIG. 6(a).

A through-hole was then formed as in Example 1-1.

A wiring layer was then formed as in Example 1-1. Thus, the through-hole electrode 9 shown in FIG. 6(b) was formed.

A solder ball was then mounted to remove residual flux as in Example 1-1. Thus, the solid-state imaging device substrate having the connection bump 10 shown in FIG. 6(c) was produced.

The solid-state imaging device substrate was then diced along the cutting line shown in FIG. 6(d) as in Example 1-1. The solid-state imaging device substrate was thus separated into individual solid-state imaging devices 1a and to produce a finished product shown in FIG. 6(e), as in Example 1-1.

It is also possible to control a shape and light transmittance of the microlens 6 by carrying out a bleaching and other step as necessary.

Effect of the Present Embodiment (1) As described above, the present embodiment collectively forms the microlens 6 and the concave lens 7 by the photolithography method by use of the gray-tone mask 50. This eliminates the need for a microlens material (e.g., the photosensitive microlens material 11 and the transparent resin layer 12) to be thermally flowable, and therefore eliminating the need to use a highly heat-resistant microlens material, which makes it possible to lower material cost. This also eliminates the need to pattern the microlens material several times, which in turn enables using fewer processing steps, hence making it possible to form a solid-state imaging device at lower cost.

(2) Additionally, collectively forming the microlens 6 and the concave lens 7 by the photolithography method by use of the gray-tone mask 50 prevents the microlenses 6 from being fused together, which enables effective use of light incident on a boundary (gap region) between the adjacent microlenses 6; hence makes it possible to manufacture a more sensitive solid-state imaging device 1a. This technique is particularly effective for an improvement in light collection efficiency of a high-definition microlens having a lens pitch of 6 microns or less.

(3) Further, a limit resolution of an i-ray, which is ultraviolet light, advantageously facilitates formation of a concave lens 7 having a concave curvature diameter d of 180 nm through 365 nm or less between adjacent microlenses 6. Still further, the limit resolution of the KrF laser advantageously facilitates formation of a concave lens 7 having a concave curvature diameter d of 120 nm through 248 nm between adjacent microlenses 6.

Reference Example

As a reference example of the solid-state imaging device 1a and the method of manufacturing the same according to the present embodiment, a brief description will be given below on a solid-state imaging device and a method of manufacturing the same that do not have a technical characteristic possessed by the solid-state imaging device 1a and the method of manufacturing the same according to the present embodiment.

In recent years, a module structure that can be manufactured by a wafer process has been proposed for reduction in size and thickness of a camera module (see Patent Literatures 1 to 3). In each pixel on a photoelectric transducer surface on an upper surface of a silicon wafer on which a solid-state imaging device is formed, a color separation filter and a condensing microlens are formed.

An electrical signal of image information retrieved by the solid-state imaging device is guided to a rear surface of a silicon wafer by a conductive material that fills a through-hole formed in the silicon wafer or coats an inner wall thereof. The electrical signal can be output to, for example, an external circuit board through a ball grid array (BGA) connecting terminal.

A camera module is produced through a process of: preparing a silicon wafer having a diameter of 20 to 30 cm, which is prepared through a glass plate formation process, and a glass plate also having a diameter of 20 to 30 cm, which is prepared through a wafer formation process, and then aligning and laminating the wafer and plate until eventually cutting the laminate into individual camera modules through a dicing process.

For a camera generally mounted on a cellular phone, the silicon wafer in the camera module measures 3 mm square; hence approximately 3500 to 4300 camera modules can be formed from a single wafer having a 20-cm diameter.

A gap between the adjacent lenses (hereinafter referred to as an "inter-lens gap") needs to be close to zero to improve condensing efficiency on the solid-state imaging device. In a circumstance where the inter-lens gap is zero, however, the adjacent microlenses are bonded together, generally making it difficult to control a shape of the inter-lens gap with one nanometer accuracy.

In a circumstance where an inter-lens gap is provided, incident light that enters from the inter-lens gap creates cross-talk between adjacent pixels, which may on occasions deteriorate a condensing efficiency of the microlenses.

A proposed solution to these problems is to form a concave lens between adjacent lenses to also collect incident light between the lenses (Patent Literatures 1 to 3).

The above Patent Literatures 1 to 3 contain a description on forming a concave lens between microlenses while forming the microlenses by a thermal flow method or an etching method. These manufacturing methods, however, may on occasions prevent use of a highly heat-resistant microlens material because the material that constitutes the microlens (hereinafter referred to as microlens material) needs to be thermally flowable. In addition, these methods may on occasions increase manufacturing cost due to requirement of a plurality of patterning masks and other processing jigs for patterning on a base material of the microlens several times before thermal flow.

Second Embodiment

<Configuration>

A solid-state imaging device 1(1b) according to a second embodiment of the present invention is configured almost identically to the solid-state imaging device 1a according to the first embodiment, but is different in having a concave lens 7 whose curvature radius r is 100 nm or less. The configuration of the solid-state imaging device 1b according to the present embodiment will be described in detail below.

Figure 7:
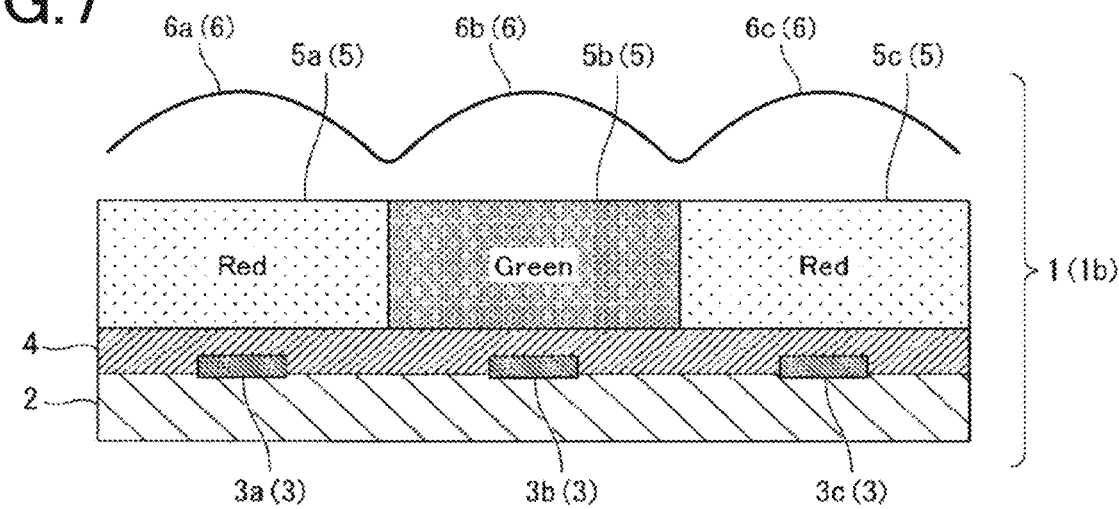
FIG. 7 is a cross-sectional view illustrating an exemplary configuration of a solid-state imaging device according to a second embodiment of the present invention.
Figure 8:
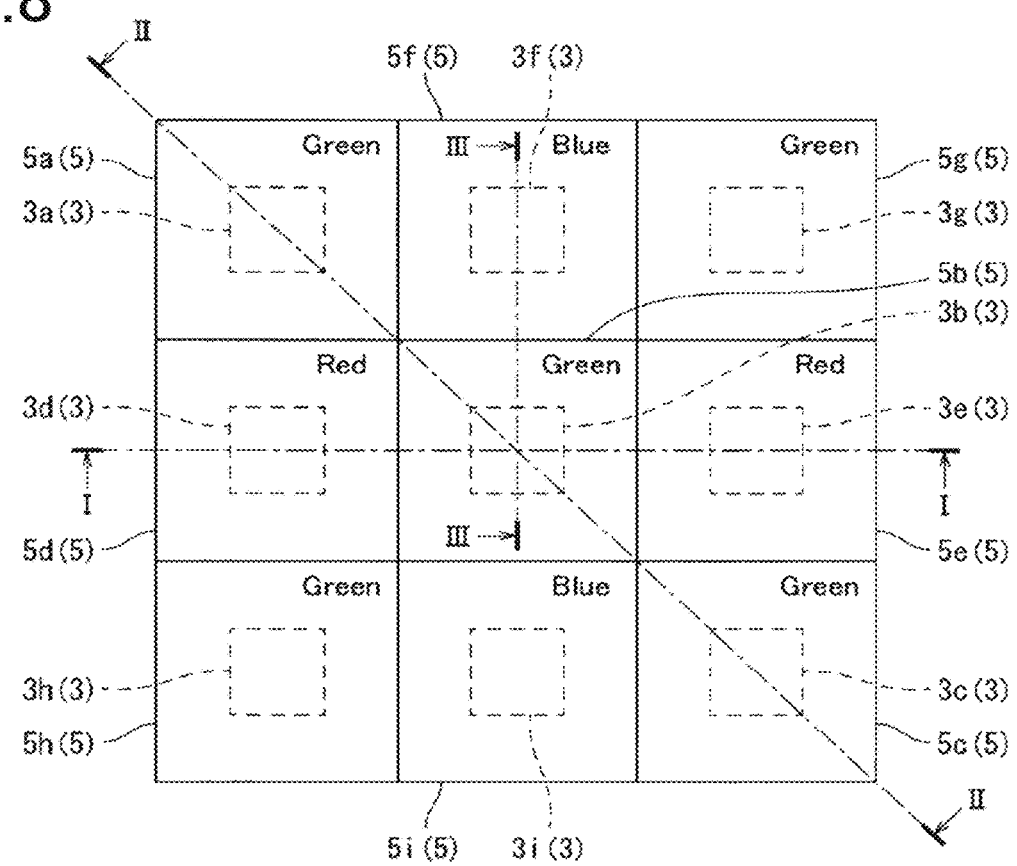
FIG. 8 is a plan view illustrating an arrangement of color filters and photoelectric transducers in a solid-state imaging device according to the second embodiment of the present invention.

As shown in FIGS. 7 and 8, the solid-state imaging device 1b according to the second embodiment of the present invention includes a semiconductor substrate 2, a plurality of photoelectric transducers 3, a flattening layer 4, a plurality of color filters 5, and a plurality of microlenses 6. FIG. 7 is a view taken along the arrow I-I in FIG. 8. In FIG. 8, for better understanding of how the plurality of photoelectric transducers 3 (3a to 3i) and the plurality of color filters 5 (5a to 5i) are arranged, other configurations in the solid-state imaging device 1b are omitted. As shown in FIG. 7, the solid-state imaging device 1b is formed by a lamination of the plurality of photoelectric transducers 3, the flattening layer 4, the color filter layer constituted by the plurality of color filters 5, and the microlens layer constituted by the plurality of microlenses 6, these components being stacked on the semiconductor substrate 2 in the stated order. Note that this configuration is identical to that of the solid-state imaging device 1*a* according to the first embodiment described above.

The semiconductor substrate 2 is a substrate for mounting the photoelectric transducer 3.

The plurality of photoelectric transducers 3 convert light incident through the microlens 6 into an electrical charge. As shown in FIG. 8, the plurality of photoelectric transducers 3 are arranged in a two-dimensional square lattice pattern with the plurality of photoelectric transducers 3 being arranged in parallel in a vertical and horizontal direction of FIG. 8. The example shown in FIG. 8 shows a part of the solid-state imaging device 1*b*, where nine photoelectric transducers 3*a* to 3*i* are arranged in the square lattice pattern.

The flattening layer 4 flattens an upper surface (a surface facing upward in FIG. 7) of the semiconductor substrate 2, a surface on which the microlenses 6 are mounted.

The plurality of color filters 5 are respectively formed on the plurality of photoelectric transducers 3 via the flattening layer 4. The plurality of color filters 5 act to transmit light of a particular wavelength in light incident on the photoelectric transducer 3. The plurality of color filters 5 are arranged in the two-dimensional square lattice pattern on the semiconductor substrate 2 because they are formed corresponding to the plurality of photoelectric transducers 3 arranged in the two-dimensional square lattice pattern in a ratio of 1:1. The plurality of color filters 5 in the present embodiment are color filters that transmit one of three colors red (R), green (G), and blue (B), and where these colors are Bayer-arranged. For example, in the example shown in FIG. 8, the color filters 5*a* to 5*i* are respectively provided in correspondence with the nine photoelectric transducers 3*a* to 3*i*. Among these filters, the color filters 5*a* to 5*c*, 5*g* and 5*h* transmit green light, the color filters 5*d* and 5*e* transmit red light, and the color filters 5*f* and 5*i* transmit blue light.

Figure 9:
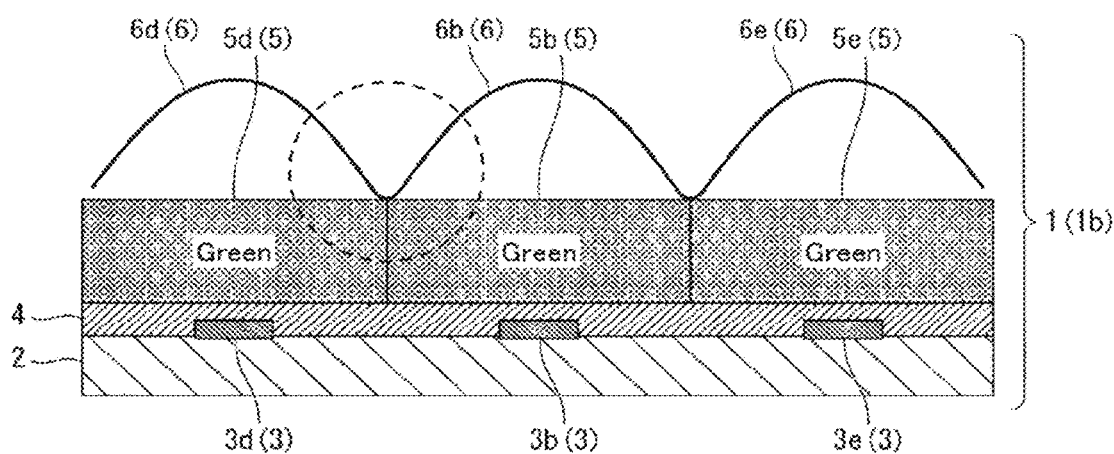
FIG. 9 is a cross-sectional view illustrating an exemplary configuration of a solid-state imaging device according to the second embodiment of the present invention.
Figure 10:
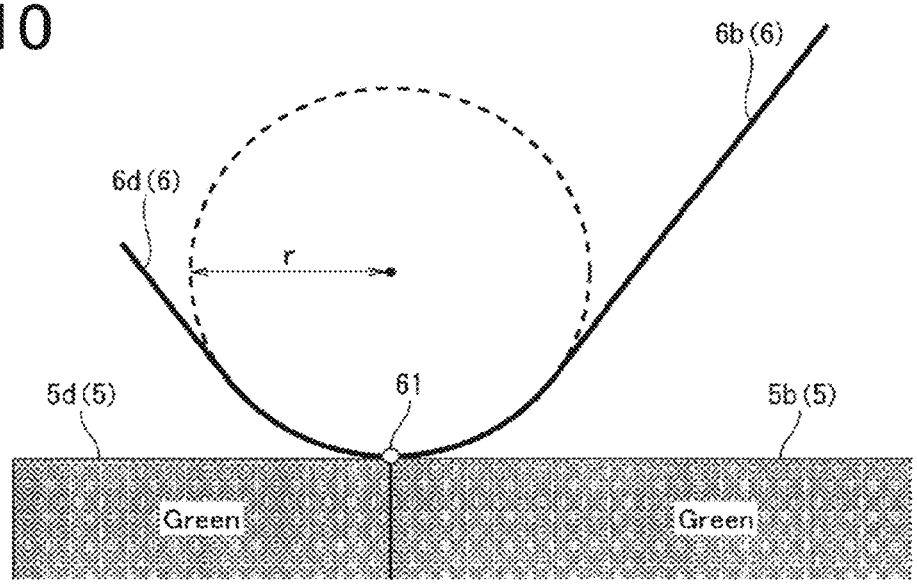
FIG. 10 is a partially enlarged cross-sectional view of FIG. 9.

The plurality of microlenses 6 are respectively formed on the plurality of color filters 5. The plurality of microlenses 6 are each made of a resin that is usually made of, for example, an acrylic resin that is preferably transparent. The plurality of microlenses 6 have a parabolic surface in a cross section parallel to a thickness direction of the semiconductor substrate 2 as shown in FIG. 7, but may have an arc-like or sinusoidal surface. The plurality of microfilters 6 are arranged in the two-dimensional square lattice pattern on the semiconductor substrate 2 because they are formed corresponding to the plurality of color filters 5 arranged in the two-dimensional square lattice pattern in a ratio of 1:1. In addition, the plurality of microlenses 6 are connected to each other on lower sides of adjacent ones. Further, a valley between the plurality of microlenses 6 in a lateral cross section and a 45-degree cross section has a curvature radius of 100 nm or less. The term "lateral cross section" here refers to a cross section in a plane parallel to a direction of the plurality of microlenses 6 arranged in the two-dimensional square lattice pattern (the vertical or horizontal direction in FIG. 8) and parallel to a thickness direction of the semiconductor substrate 2 (a direction that is longitudinal relative to the drawing plane of FIG. 8), a cross section exemplified in FIG. 7. On the other hand, the 45-degree cross section is a cross section in a plane parallel to a direction inclined by 45 degrees on the semiconductor substrate 2, a direction relative to the arrangement direction of the plurality of microlenses 6, and parallel to the thickness direction of the semiconductor substrate 2, a cross section shown in FIG. 9, which is a view taken along the arrow of FIG. 8. The curvature radius of the valley between the plurality of microlenses 6 is a curvature radius at the lowermost point, which is the deepest point of the valley between the adjacent microlenses 6. For example, in the 45-degree cross section shown in FIG. 9, the lowermost point of a valley between a microlens 6*d* and a microlens 6*b* is indicated by reference numeral 61, and the curvature radius at the lowermost point 61 is indicated by reference character r, as shown in an enlarged view in FIG. 10. The curvature radius r is expressed by the following formula (1), where, f(a) indicates a shape curve of the valley between the microlenses 6, and "a" indicates the lowermost point of the valley between the microlenses 6.

Eq. 1

$$r = \frac{\sqrt{(1 + f'(a)^2)^3}}{f''(a)} \quad (1)$$

Figure 11:
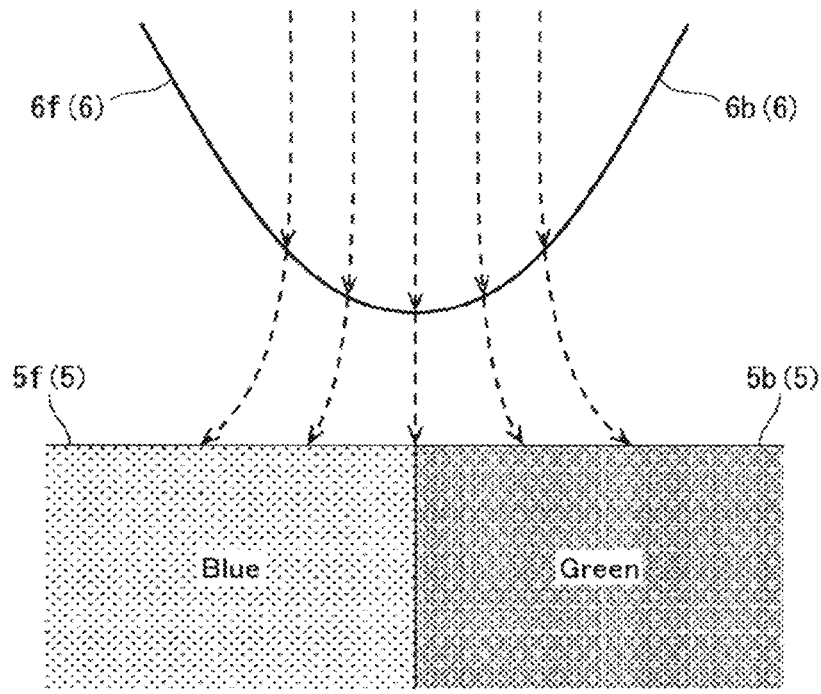
FIG. 11 is an explanatory view illustrating an optical path of light incident between microlenses in a circumstance where a curvature radius of a valley is large.
Figure 12:
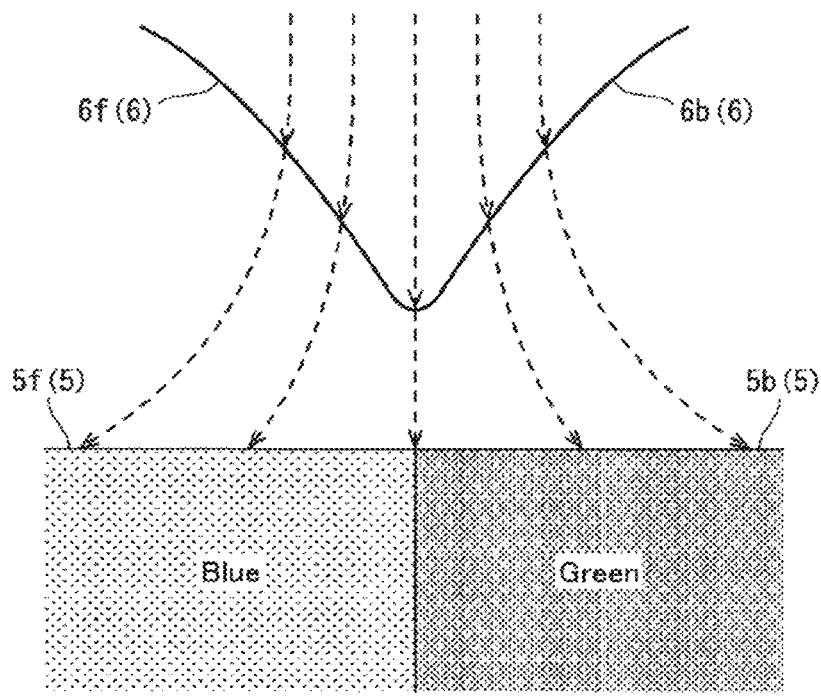
FIG. 12 is an explanatory view illustrating an optical path of incident light between microlenses in a circumstance where a curvature radius of a valley is small.

In a circumstance where the curvature radius r of the valley between the adjacent microlenses 6 is above 100 nm, the light incident on the microlens 6 in a vicinity of an adjacency above the blue color (color filter 5*f*) is influenced by the cross-talk to be redirected to a colored transparent pixel of green (color filter 5*b*) having a higher refractive index than blue in the color filter layer, for example, as shown in FIG. 11, which is a view taken along the arrow in FIG. 8. In a circumstance where the curvature radius r of the valley between the adjacent microlenses 6 is 100 nm or less, on the other hand, the light incident on the microlens in the vicinity of the adjacency above the blue color (color filter 5*f*) mostly passes through the color filter 5*f* and the flattening layer 4 without being redirected into the photoelectric transducer 3 due to reduced influence of cross-talk, for example, as shown in FIG. 12, which is also a view taken along the arrow in FIG. 8.

<Manufacturing Method>

Now a method of manufacturing the solid-state imaging device 1*b* according to the present embodiment will be described with reference to FIGS. 13(*a*)-13(*e*).

The first step is to sequentially form a flattening layer 4 (not shown in FIGS. 13(*a*)-13(*e*)) and a color filter layer that is constituted by a plurality of color filters 5 on a semiconductor substrate 2 (not shown in FIGS. 13(*a*)-13(*e*)) on which a plurality of photoelectric transducers 3 (a filter formation step). In the filter formation step, three types of color filters 5 each corresponding to any one of R, G, and B are arranged and laminated on a plurality of photoelectric transducers 3 to have a predetermined pattern, for example, as shown in FIG. 8.

Figure 13A:
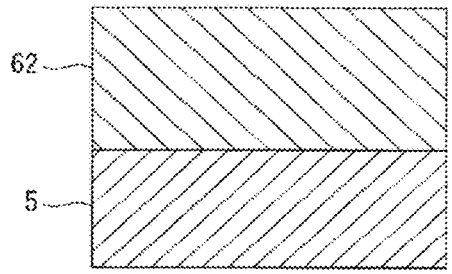
FIGS. 13(a)-13(e) are explanatory views illustrating a method for manufacturing the solid-state imaging device according to the second embodiment of the present invention.
Figure 13B:
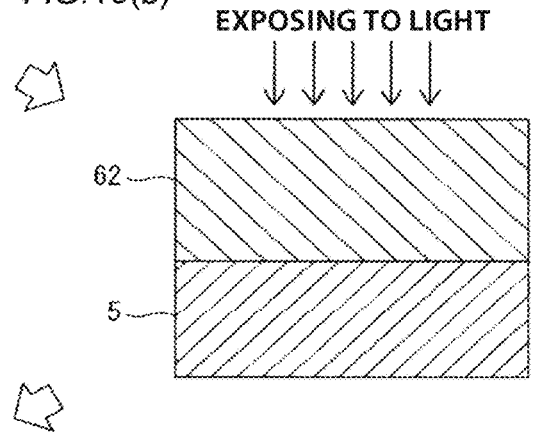
Figure 13C:
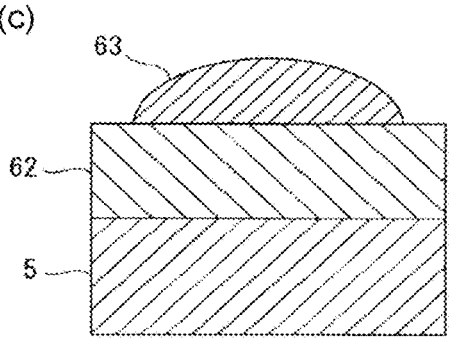
Figure 13D:
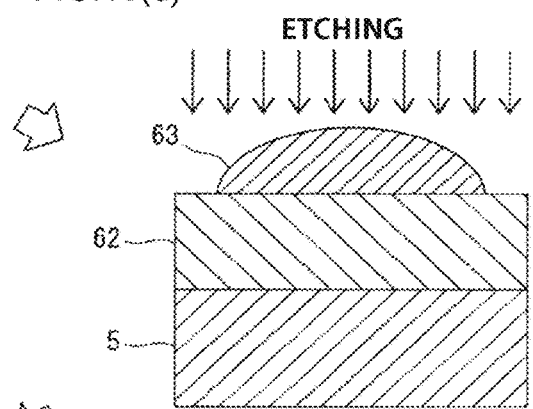
Figure 13E:
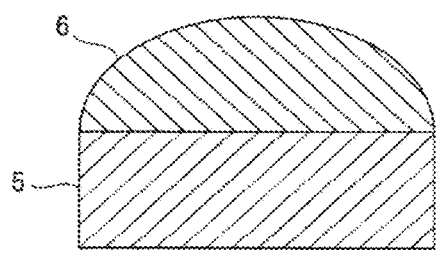

The filter formation step is followed by the step of forming a plurality of microlenses 6 on the plurality of color filters 5 (a lens formation step). In the lens formation step, a photosensitive transparent resin is firstly applied onto a plurality of color filters 5 with a predetermined thickness to form a transparent resin layer 62, as shown in FIG. 13(*a*). As shown in FIGS. 13(*b*) and 13(*c*), an upper side that serves as a front surface of the transparent resin layer 62 is exposed, developed and baked by a photolithography method by use of a gray-tone mask (not shown in FIGS. 13(*a*)-13(*e*)) to form a mold 63 for the microlenses 6. Using a gray-tone mask that allows arbitrary variation in the mask transmittance gradation to fit in with a desired shape of the microlens at this time makes it easier to control a shape of the mold 63 for the microlens 6. In addition, the mold 63 for the microlens 6 formed on a layer above the transparent resin layer 62 is transferred by a dry-etching transfer method to an identical transparent resin layer 62, as shown in FIGS. 13(d) and 13(e). The mold 63 can be transferred to a layer below the transparent resin layer 62 at an identical etching rate at this time to form a single microlens layer, which makes it possible to faithfully transfer the mold 63 formed on the upper layer. Further, adjusting etching conditions, particularly a gas type, a gas pressure, a chamber pressure, and an applied voltage, makes it possible to form a microlens 6 with a narrower valley between adjacent microlenses 6.

Effect of the Present Embodiment (1) The solid-state imaging device 1b according to one mode of the present invention includes a plurality of photoelectric transducers 3 formed and arranged on a semiconductor substrate 2 in a two-dimensional square lattice pattern, a plurality of color filters 5 respectively formed on the plurality of photoelectric transducers 3, and a plurality of microlenses 6 respectively formed on the plurality of color filters 5, wherein a curvature radius r of a valley (concave lens) between the plurality of microlenses 6 is 100 nm or less in a lateral cross section parallel to a direction in which the plurality of microlenses 6 are arranged and parallel to a thickness direction of the semiconductor substrate and in a 45-degree cross section parallel to a direction inclined by 45 degrees on the semiconductor substrate 2 relative to the direction in which the plurality of microlenses 6 are arranged and parallel to a thickness direction of the semiconductor substrate 2 relative to the direction in which the plurality of microlenses 6 are arranged.

In such a configuration, setting the curvature radius r of the valley between the microlenses 6 in the lateral cross section and the 45-degree cross section to 100 nm or less can reduce aberration arising from a difference in a curvature ratio of a microlens shape between the cross section and the 45-degree cross section, which can in turn enhance light-condensing efficiency. Such a configuration can also reduce the influence of cross-talk at the valley between the microlenses 6, which can also enhance light-condensing efficiency.

(2) In addition, the plurality of microlenses 6 included in the solid-state imaging device 1b according to one mode of the present invention may have a surface having any one of an arc-like shape, a parabolic shape, or a sinusoidal shape in a cross section parallel to the thickness direction of the semiconductor substrate 2.

(3) Further, a method of manufacturing the solid-state imaging device 1b according to one mode of the present invention includes a filter formation step, a step of forming a plurality of color filters 5 respectively on a plurality of photoelectric transducers 3 arranged and formed on the semiconductor substrate 2 in a two-dimensional square lattice pattern, and a lens formation step, a step of forming a plurality of microlenses 6 respectively on the plurality of color filters 5 after the filter formation step, wherein, in the lens formation step, the plurality of microlenses 6 are formed by applying a transparent resin onto the plurality of color filters 5 to form a transparent resin layer 62, and forming a mold 63 by a photolithography method by use of a gray-tone mask on an upper layer that serves as a surface of the transparent resin layer 62, and transferring the molds 63 for the plurality of microlenses 6 to a lower layer of the transparent resin layer 62 by a dry-etching transfer method.

In such a configuration, forming the mold 63 for the microlens 6 on the upper layer of the microlenses 6 by the photolithography method by use of the gray-tone mask makes it easier to control a lens shape than forming a microlens shape by a thermal reflow method. This makes it possible to select and form a most appropriate microlens shape for each solid-state imaging device, having an effect of condensing light to the photoelectric transducer 3 more efficiently.

In addition, transferring the mold 63 for the microlens 6 to the lower layer of the microlens 6 by the dry-etching transfer method makes it possible to narrow the valley between the adjacent microlenses 6, also having an effect of condensing light to the photoelectric transducer 3 more efficiently.

Such a configuration enables collective formation of the microlenses 6 by the photolithography method by use of the gray-tone mask. This eliminates the need for a microlens material (e.g., the transparent resin layer 62) to be thermally flowable, and therefore eliminates the need to use a highly heat-resistant microlens material, which in turn makes it possible to lower material cost. This also eliminates the need to pattern the microlens material several times, which enables fewer processing steps; hence making it possible to form a solid-state imaging device at lower cost.

(4) In the lens formation step included in the method for manufacturing the solid-state imaging device 1b according to one mode of the present invention, a shape of the mold 63 for the plurality of microlenses 6 may be controlled by forming the mold 63 for the plurality of microlenses 6 by the photolithography method.

(5) In the lens formation step included in the method for manufacturing the solid-state imaging device 1b according to one mode of the present invention, at a time of transfer of the mold 63 for the plurality of microlenses 6 to the lower layer, the curvature radius r of the valley between the plurality of microlens 6 may be controlled to be 100 nm or less in the lateral cross section parallel to the direction in which the plurality of microlenses 6 are arranged and parallel to the thickness direction of the semiconductor substrate 2 and in a 45-degree cross section parallel to the direction inclined by 45 degrees on the semiconductor substrate 2 relative to the direction in which the plurality of microlenses 6 are arranged and parallel to the thickness direction of the semiconductor substrate 2 relative to the direction in which the plurality of microlenses 6 are arranged.

(6) In the lens formation step included in the method for manufacturing the solid-state imaging device 1b according to one embodiment of the present invention, the upper layer of the plurality of microlenses 6 may be formed by the photolithography method, and the lower layer of the plurality of microlenses 6 may be formed by the dry-etching transfer method.

Example 2-1

Example 2-1 will be described below.

In Example 2-1, a silicon wafer having a 0.7.5-mm thickness and a 20-cm diameter was used as a semiconductor substrate 2. A photoelectric transducer 3 was formed on an upper part of a surface of the silicon wafer, and a flattening layer 4 was formed on an uppermost layer thereof by spin-coating a thermosetting acrylic resin coating solution.

A color filter layer constituted by tricolored color filters 5 was sequentially formed on the flattening layer 4 by a photolithography method by use of red (R), green (G), and blue (B) color resists. Each color filter layer was 0.5 μm to 0.8 µm in thickness. The pixel arrangement in the color filter layer was a so-called Bayer arrangement, an arrangement in which a G (green) filter are provided at every other pixel and an R (red) filter and a B (blue) filter were provided on every other line between the G filters.

In addition, an alkali-soluble and photosensitive acrylic transparent resin was coated on the color filter layer with a 1.4-µm thickness before being heated at 180° C. for 3 minutes for hardening. An acrylic transparent resin layer 62 was thus formed.

A mold 63 for a microlens 6 was then formed on the acrylic transparent resin layer 62 by a photolithography method by use of a gray-tone mask. The gray-tone mask was a light-shielding film formed on a quartz substrate, a light-shielding film that had high transmittance in a part corresponding to a thin part of a microlens element to be formed and that had a gradation of shades. The shading of this gradation is achieved by a partial difference in density per unit area, a partial difference in the number of small diameter dots that are not resolved by exposure light. The gray-tone mask used in Example 2-1 is one that was photomasked so that the mold 63 for the microlens 6 may be parabolic. The mold 63 for the microlens 6 was thus parabolic and 0.6 µm high.

The mold 63 for the parabolic microlens 6 was then transferred to the acrylic transparent resin layer 62 underneath by the dry-etching transfer method. At this time, the microlens 6 was dry-etched for two minutes by use of a mixed gas of fluorocarbon gases $CF_4$ and $C_3F_8$ and noble gas Ar until it became 0.45 µm high.

Measuring a shape of the microlens 6 formed in Example 2-1 with a scanning probe microscope confirmed that the microlens 6 formed in Example 2-1 was formed to be parabolic, and a curvature radius r of a valley between adjacent microlenses 6 was 50 nm in a cross sectional direction and 24 nm in a 45-degree cross sectional direction.

In addition, measuring light-condensing efficiencies of the solid-state imaging device 1(b) formed in Example 2-1 and a conventional solid-state imaging device confirmed that the former was approximately 5.1% better, as shown in Table 1. In Comparative Example 2-1, which is a comparison with Example 2-1, a microlens 6 was formed by a photolithography method by use of a gray-tone mask, the microlens 6 being parabolic and a curvature radius r of the valley therebetween being 124 nm in the cross sectional direction and 74 nm in the 45-degree cross sectional direction.

Note that the "sensitivity" shown in Table 1 is a numerical value in a case where the sensitivity of the conventional solid-state imaging device (Comparative Example 2-1) is assumed to be 100%. In other words, the sensitivity of the solid-state imaging device 1b formed in Example 2-1, where the conventional solid-state imaging device is made more sensitive, is 105.1% as compared with that of the conventional one.

TABLE 1

| | Microlens shape | Curvature radius [nm] | | Sensitivity |
| --- | --- | --- | --- | --- |
| | | Lateral cross section | 45-degree cross section | |
| Example 2-1 | Parabolic | 50 | 24 | 105.1% |
| Comparative Example 2-1 | | 124 | 74 | 100.0% |

Example 2-2

Example 2-2 will be described below.

In Example 2-2, a photoelectric transducer 3 was formed on an upper surface part of a silicon wafer, and a flattening layer 4 was formed on an uppermost layer thereof, as in Example 2-1.

A color filter layer constituted by red (R), green (G), and blue (B) color filters 5 was then formed on the flattening layer 4, as also in Example 2-1.

In addition, an acrylic transparent resin was applied onto the color filter layer for hardening, again as in Example 2-1. An acrylic transparent resin layer 62 was thus formed.

A mold 63 for a microlens 6 was then formed on the acrylic transparent resin layer 62 by a photolithography method by use of a gray-tone mask. The gray-tone mask used in Example 2-2 was one that is photomasked so that the mold 63 for the microlens 6 may be arc-shaped. The mold 63 for the microlens 6 was thus arc-shaped and 0.6 µm high.

The mold 63 for the arc-shaped microlens 6 was then transferred to the acrylic transparent resin layer 62 underneath by the dry-etching transfer method, as in Example 2-1.

Measuring a shape of the microlens 6 formed in Example 2-2 with a scanning probe microscope confirmed that the microlens 6 formed in Example 2-2 was formed to be arc-shaped, and a curvature radius r of a valley between adjacent microlenses 6 was 67 nm in a cross sectional direction and 35 nm in a 45-degree cross sectional direction, as shown in Table 2.

In addition, measuring light-condensing efficiencies of the solid-state imaging device 1b formed in Example 2-2 and a conventional solid-state imaging device confirmed that the former was approximately 4.7% better. In Comparative Example 2-2, which was a comparison with Example 2-2, a microlens 6 was formed by a photolithography method by use of a gray-tone mask, the microlens 6 being arc-shaped and a curvature radius r of a valley therebetween being 158 nm in a cross sectional direction and 87 nm in a 45-degree cross sectional direction.

Note that the "sensitivity" shown in Table 2 is a numerical value in a case where the sensitivity of the conventional solid-state imaging device (Comparative Example 2-2) is assumed to be 100%. In other words, the sensitivity of the solid-state imaging device 1(b) formed in Example 2-2, where the conventional solid-state imaging device is made more sensitive, is 104.7% as compared with that of the conventional one.

TABLE 2

| | Microlens shape | Curvature radius [nm] | | Sensitivity |
| --- | --- | --- | --- | --- |
| | | Lateral cross section | 45-degree cross section | |
| Example 2-2 | Arc | 67 | 35 | 104.7% |
| Comparative Example 2-2 | | 158 | 87 | 100.0% |

Example 2-3

Example 2-3 will be described below.

In Example 2-3, a photoelectric transducer 3 was formed on an upper surface part of a silicon wafer, and a flattening layer 4 was formed on an uppermost layer thereof, as in Example 2-1.

A color filter layer constituted by red (R), green (G), and blue (B) color filters 5 was then formed on the flattening layer 4, as also in Example 2-1.

In addition, an acrylic transparent resin was applied onto the color filter layer for hardening, again as in Example 2-1. An acrylic transparent resin layer 62 was thus formed.

A mold 63 for a microlens 6 was then formed on the acrylic transparent resin layer 62 by a photolithography method by use of a gray-tone mask. The gray-tone mask used in Example 2-3 is one that is photomasked so that the mold 63 for the microlens 6 may be sinusoidal. The mold 63 for the microlens 6 was thus sinusoidal and 0.6 µm high.

The mold 63 for the sinusoidal microlens 6 was then transferred to the acrylic transparent resin layer 62 underneath by a dry-etching transfer method, as in Example 2-1.

Measuring a shape of the microlens 6 formed in Example 2-3 with a scanning probe microscope confirmed that the microlens 6 was formed to be sinusoidal, and a curvature radius r of a valley between adjacent microlens 6 was 89 nm in a cross sectional direction and 56 nm in a 45-degree cross sectional direction, as shown in Table 3.

In addition, measuring light-condensing efficiencies of the solid-state imaging device 1b formed in Example 2-3 and a conventional solid-state imaging device confirmed that the former was approximately 3.9% better. In Comparative Example 2-3, which is a comparison with Example 2-3, a microlens 6 was formed by a photolithography method by use of a gray-tone mask, the microlens 6 being sinusoidal and a curvature radius r of a valley therebetween being 177 nm in a cross sectional direction and 99 nm in a 45-degree cross sectional direction.

Note that the "sensitivity" shown in Table 3 is a numerical value in a case where the sensitivity of the conventional solid-state imaging device (Comparative Example 2-3) is assumed to be 100%. In other words, the sensitivity of the solid-state imaging device 1b formed in Example 2-3, where the conventional solid-state imaging device is made more sensitive, is 103.9% as compared with that of the conventional one.

TABLE 3

| | | Curvature radius [nm] | | |
|---|---|---|---|---|
| | Microlens shape | Lateral cross section | 45-degree cross section | Sensitivity |
| Example 2-3 | Sinusoidal | 89 | 56 | 103.9% |
| Comparative Example 2-3 | | 177 | 99 | 100.0% |

Reference Example

As a reference example of the solid-state imaging device 1b and the method of manufacturing the same according to the present embodiment, a brief description will be given below of a solid-state imaging device and a method of manufacturing the same that do not have a technical characteristic possessed by the solid-state imaging device 1b and the method of manufacturing the same according to the present embodiment.

In recent years, imaging devices have been widely used as more images are recorded and more content is communicated and broadcast. Among various types of imaging devices that have been proposed, an imaging device having a small, lightweight, and sophisticated solid-state imaging device incorporated are becoming common as digital cameras and digital video, solid-state imaging devices being now stably manufactured.

The solid-state imaging device has a plurality of photoelectric transducers that receive an optical image from an object and convert incident light into an electrical signal. The photoelectric transducers are roughly classified into a charge coupled device (CCD) type and a complementary metal oxide semiconductor (CMOS) type. The photoelectric transducers are also roughly classified into linear sensors (line sensors) and area sensors (surface sensors) in terms of how the photoelectric transducers are arranged, the former having photoelectric transducers arranged in a row, and the latter having photoelectric transducers arranged two-dimensionally (lengthwise and breadthwise). The larger the number of photoelectric transducers (the number of pixels) are, the more precise an acquired image either sensor provides, so that a method of manufacturing a high-resolution solid-state imaging device at low cost has been being studied particularly in recent years.

In addition, a color solid-state imaging device as a single-plate type color sensor is widely used as well, the color solid-state imaging device being capable of retrieving color information of an object with a color filtering function provided in a path of light incident on the photoelectric transducer, the color filtering function allowing light of a particular wavelength to pass through. In the color solid-state imaging device, a single pixel constituted by a particular colored transparent pixel is patterned in correspondence to a single photoelectric transducer and numerous patterned pixels are regularly arranged, which enables the color solid-state imaging device to collect chromatically resolved image information. The three-primary color system, which consists of red (R), green (G), and blue (B), and the complementary color system, which consists of cyan (C), magenta (M), and yellow (Y), are common as a color of the colored transparent pixel. The three-primary color system, in particular, is widely used.

One of the important performance issues required of the solid-state imaging device is to improve the sensitivity to incident light. Increasing an amount of information on an image captured by a miniaturized solid-state imaging device requires miniaturization of a photoelectric transducer that serves as a light receiver for higher integration. Integrating photoelectric transducers more highly, however, reduces an area of each photoelectric transducer, which in turn leaves a lower area ratio available as a light receiver, so that a smaller amount of light can be taken in by the light receiver of the photoelectric transducer, resulting in deteriorated effective sensitivity.

Proposed as a means for preventing such a miniaturized solid-state imaging device from being less sensitive is a technique for forming a microlens of a uniform shape on the photoelectric transducer to efficiently collect light to the light receiver of the photoelectric transducer, the microlens condensing light incident from an object and guiding the light to the light receiver. Condensing light with the microlens and guiding the light to the light receiver of the photoelectric transducer can increase an apparent aperture ratio of the light receiver, and in turn make the solid-state imaging device more sensitive.

Available methods of forming the microlenses are methods of a flow-lens type and a dry-etching transfer type. In the flow-lens method, a transparent acrylic photosensitive resin that serves as a material of the microlens is selectively patterned by a photolithography method before the lens is shaped by virtue of thermal reflowability of the material. In the dry-etching transfer method, a lens mold is formed on a flattening layer of an acrylic transparent resin that serves as a material of the microlens by use of an alkali-soluble, photosensitive, and thermally flowable resist material by the photolithography method and thermal reflow. The shape of the lens mold is then transferred to an acrylic transparent resin layer by a dry-etching method to shape the lens (for example, JP-2014-174456 A).

Having an increasing number of pixels, recent solid-state imaging devices are now required to have more than several million pixels. The high definition is accompanied by lowered sensitivity and more flare and other microlens noise, which may on occasions lower image quality.

An amount of light that can be taken into a light receiver of a photoelectric transducer from a microlens varies depending on a type and thickness of a layer disposed below the microlens; hence a solid-state imaging device configuration by use of a single microlens shape may possibly cause the device to be less sensitive.

In addition, a large curvature radius of a valley on a lateral cross section between adjacent microlenses and on a 45-degree cross section may on occasions be significantly influenced by a phenomenon called cross-talk, a phenomenon in which a certain amount of light leaks from the valley between the microlenses to an adjacent color filter layer. More specifically, the cross-talk here is a phenomenon in which light that should originally enter a certain color is affected by a difference in a refractive index of a pigment of each color to enter a next color. Under the influence of the cross-talk, a color with a low refractive index loses light to the next color with a higher refractive index, so that the light receiver receives a smaller amount of light, which may cause lowered sensitivity.

Further, a large curvature radius of the valley on the lateral cross section between the adjacent microlenses and on the 45-degree cross section produces a difference in the curvature radius of a microlens shape between a cross section and a 45-degree cross section of a substantially rectangular pixel in a plan view, which may cause aberration, possibly resulting in lowered light-condensing efficiency.

A microlens optimally shaped according to each solid-state imaging device and having a narrowed curvature radius of a valley between microlenses can alleviate the influence of cross-talk, which leads to better sensitivity of the solid-state imaging device.

However, the above two methods of forming microlenses, which are both based on thermal reflow, can narrow the curvature radius of the valley between the microlenses, but have difficulty in processing the microlenses to an optimum shape.

As for a conventional method of manufacturing a solid-state imaging device, when forming multiple microlenses provided in a solid-state imaging device, it was necessary for a material constituting the microlens to be patterned multiple times. This requires preparation of multiple processing jigs such as a patterning mask, which causes a problem of high manufacturing cost.

The present invention has an aspect to provide a solid-state imaging device that can be manufactured at lower cost and a method of manufacturing the same.

The solid-state imaging device according to one mode of the present invention is characterized in including a substrate, a plurality of microlenses formed on one surface side of the substrate, and at least one concave lens formed at a boundary between adjacent ones of the plurality of microlenses and depressed toward the one surface of the substrate.

The method of manufacturing a solid-state imaging device according to one mode of the present invention including a substrate, a plurality of microlenses formed on one surface of the substrate, and at least one concave lens formed at a boundary between adjacent ones of the plurality of microlenses and depressed toward the one surface of the substrate, the method being characterized in including the step of collectively forming the microlenses and the concave lenses by a photolithography method by use of a gray-tone mask.

According to one mode of the present invention, a solid-state imaging device can be produced at low cost.

Technical Idea of the Present Invention

The technical idea of the present invention is not limited to each embodiment or example described above. Based on knowledge of a person skilled in the art, each embodiment and each example may be subject to design modification and the like, and be combined in any way. Modes where such changes are made are also included in the technical idea of the present invention.

REFERENCE SIGNS LIST 1, 1a-1b . . . Solid-state imaging device
2 . . . Semiconductor substrate (silicon substrate)
2' . . . Silicon wafer
3, 3a-3e . . . Photoelectric transducer
4 . . . Flattening layer
5, 5a-5i . . . Color filter (for color separation)
6, 6a-6f . . . Microlens
7 . . . Concave lens
7a, 7c . . . V-shape
7b, 7d . . . Concave shape
8 . . . Lens module
9 . . . Through-hole electrode
10 . . . Connection bump
11 . . . Photosensitive microlens material
12 . . . Transparent resin layer
13 . . . Photosensitive sacrificing layer
13a . . . Lens mold
50 . . . Gray-tone mask
61 . . . Lowermost point
62 . . . Transparent resin layer
63 . . . Mold
d . . . Curvature diameter
r . . . Curvature radius Obviously, numerous modifications and variations of the present invention are possible in light of the above teachings. It is therefore to be understood that within the scope of the appended claims, the invention may be practiced otherwise than as specifically described herein.

What is claimed is:

1. A solid-state imaging device, comprising:
a substrate having a surface;
a plurality of microlenses formed on the surface; and
a concave lens formed between adjacent ones of the plurality of microlenses and having a concave shape directed toward the surface of the substrate, the concave lens having a curved shape with a curvature radius of 100 nm or less in a 45-degree cross section along a direction which is inclined by 45 degrees relative to a first direction on the substrate and is parallel to a thickness direction of the substrate.

2. The solid-state imaging device of claim 1, wherein the concave lens is one of a plurality of concave lenses formed in a square lattice pattern and arrayed in two directions on the surface of the substrate such that each of the plurality of concave lenses is formed between adjacent ones of the plurality of microlenses, each of the plurality of concave lenses has a curvature radius of 100 nm or less in a lateral cross section along the first direction of the two directions and is parallel to the thickness direction of the substrate, and each of the plurality of concave lenses has a curvature radius of 100 nm or less in a 45-degree cross section along the direction which is inclined by 45 degrees relative to the first direction on the substrate and is parallel to the thickness direction of the substrate.

3. A solid-state imaging device, comprising:

a plurality of photoelectric transducers formed on a substrate in a square lattice pattern and arrayed in two directions on the substrate;

a plurality of color filters formed respectively on the plurality of photoelectric transducers; and a plurality of microlenses formed respectively on the plurality of color filters, the plurality of microlenses including adjacent microlenses having a valley portion formed therebetween, wherein the valley portion is one of a plurality of valley portions formed in the square lattice pattern and arrayed in the two directions such that each of the plurality of valley portions is formed between adjacent microlenses of the plurality of microlenses, each of the plurality of valley portions has a curvature radius of 100 nm or less in a lateral cross section along a direction which is one of the two directions and is parallel to a thickness direction of the substrate, and each of the plurality of valley portions has a curvature radius of 100 nm or less in a 45-degree cross section along a direction which is inclined by 45 degrees relative to the one of the two directions on the substrate and is parallel to the thickness direction of the substrate.

4. The solid-state imaging device of claim 3, wherein each of the plurality of microlenses has a shape of an arc, a parabola, or a sine wave in the lateral cross section parallel to the thickness direction of the substrate.

5. A method of manufacturing the solid-state imaging device of claim 1, comprising:

forming the plurality of microlenses simultaneously with concave lenses by photolithography using a gray-tone mask.

6. The method of claim 5, further comprising:

forming a photoelectric transducer on the surface of the substrate before the forming of the plurality of microlenses.

7. The method of claim 5, wherein the forming of the plurality of microlenses includes placing a photosensitive microlens material on a side of the substrate, and patterning the photosensitive microlens material by the photolithography using the gray-tone mask.

8. The method of claim 5, wherein the forming of the plurality of microlenses includes forming a transparent resin layer on the surface of the substrate, forming a photosensitive sacrificing layer on the transparent resin layer, patterning the photosensitive sacrificing layer by the photolithography using the gray-tone mask such that a microlens mold is formed, and etching the microlens mold and the transparent resin layer.

9. The method of claim 6, further comprising:

forming a plurality of color filters on the photoelectric transducer before the forming of the plurality of microlenses, wherein the forming of the photoelectric transducer includes forming a plurality of photoelectric transducers in a two-dimensional square lattice pattern on the substrate, and the forming of the plurality of microlenses includes forming a transparent resin layer on the color filters, forming a microlens mold on an upper side of the transparent resin layer by photolithography using a gray-tone mask, and transferring the microlens mold to a lower side of the transparent resin layer by dry-etching transfer such that the plurality of microlenses are formed respectively on the color filters.

10. The method of claim 8, wherein the forming of the microlens mold is conducted by the photolithography used in the forming of the plurality of microlenses such that a shape of the microlens mold is controlled.

11. The method of claim 8, wherein the transferring of the microlens mold is conducted such that each of the concave lenses has a curvature radius of 100 nm or less in a lateral cross section along the direction which is one of the two directions and is parallel to the thickness direction of the substrate, and each of the concave lenses has a curvature radius of 100 nm or less in a 45-degree cross section along the direction which is inclined by 45 degrees relative to the one of the two directions on the substrate and is parallel to the thickness direction of the substrate.

12. The method of claim 8, wherein the forming of the plurality of microlenses includes forming an upper surface of the plurality of microlenses by the photolithography using the gray-tone mask and forming a lower surface of the plurality of microlenses by dry-etching transfer.

13. The method of claim 5, wherein the photolithography employs an i-ray or KrF laser as ultraviolet light.

* * * * *